(12) United States Patent
Pei et al.

(10) Patent No.: US 10,686,063 B2
(45) Date of Patent: Jun. 16, 2020

(54) SEMICONDUCTOR DEVICE AND METHOD FOR MANUFACTURING THE SAME

(71) Applicant: DYNAX SEMICONDUCTOR, INC., Kunshan, Jiangsu Province (CN)

(72) Inventors: Yi Pei, Kunshan (CN); Chenggong Yin, Kunshan (CN)

(73) Assignee: DYNAX SEMICONDUCTOR, INC., Kunshan, Jiangsu Province (CN)

( * ) Notice: Subject to any disclaimer, the term of this patent is extended or adjusted under 35 U.S.C. 154(b) by 0 days.

(21) Appl. No.: 16/080,235

(22) PCT Filed: Apr. 13, 2018

(86) PCT No.: PCT/CN2018/082993
§ 371 (c)(1),
(2) Date: Aug. 27, 2018

(87) PCT Pub. No.: WO2018/188649
PCT Pub. Date: Oct. 18, 2018

(65) Prior Publication Data
US 2019/0043977 A1  Feb. 7, 2019

(51) Int. Cl.
| | |
|---|---|
| H01L 29/66 | (2006.01) |
| H01L 29/778 | (2006.01) |
| H01L 29/417 | (2006.01) |
| H01L 29/205 | (2006.01) |
| H01L 29/20 | (2006.01) |
| H01L 29/47 | (2006.01) |
| H01L 29/423 | (2006.01) |

(52) U.S. Cl.
CPC ........ *H01L 29/7783* (2013.01); *H01L 29/205* (2013.01); *H01L 29/41725* (2013.01); *H01L 29/66431* (2013.01); *H01L 29/66462* (2013.01); *H01L 29/7786* (2013.01); *H01L 29/2003* (2013.01); *H01L 29/42316* (2013.01); *H01L 29/475* (2013.01)

(58) Field of Classification Search
None
See application file for complete search history.

(56) References Cited

U.S. PATENT DOCUMENTS

| | | | | |
|---|---|---|---|---|
| RE32,613 E | * | 2/1988 | Lepselter | H01L 21/033 257/757 |
| 6,870,232 B1 | * | 3/2005 | Chan | H01L 27/095 257/330 |
| 2013/0240896 A1 | * | 9/2013 | Ozaki | H01L 29/7786 257/76 |

* cited by examiner

*Primary Examiner* — Calvin Y Choi
(74) *Attorney, Agent, or Firm* — Armstrong Teasdale LLP

(57) ABSTRACT

The present disclosure provides a semiconductor device and a manufacturing method thereof. The semiconductor device includes a semiconductor layer, a source and a drain located on one side of the semiconductor layer, a blocking layer located on one side of the semiconductor layer, the blocking layer including silicide, wherein the distance between an interface at one side of the blocking layer close to the semiconductor layer and the semiconductor layer is equal to or more than 10 nm, and a gate located between the source and the drain, the gate penetrating through the blocking layer, the gate including a first conductive layer and a second conductive layer, the first conductive layer being close to the semiconductor layer, the second conductive layer being located on one side of the first conductive layer away from the semiconductor layer, and the first conductive layer including nickel.

16 Claims, 8 Drawing Sheets

Forming a gate trench by etching the blocking layer and the capping layer between the source and the drain — S1051

Depositing a gate comprising a first conductive layer and a second conductive layer on the gate trench — S1052

SEMICONDUCTOR DEVICE AND METHOD FOR MANUFACTURING THE SAME

CROSS REFERENCE TO RELATED APPLICATIONS

This patent application is a National Stage Entry of PCT/CN2018/082993 filed on Apr. 13, 2018, which claims the benefit and priority of Chinese Patent Application No. 201710245923.7 filed on Apr. 14, 2017, the disclosures of which are incorporated herein by reference in their entirety as part of the present application.

BACKGROUND

The present disclosure relates to a technical field of semiconductor, and particularly relates to a semiconductor device and a method for manufacturing the same.

The third-generation semiconductor material gallium nitride (GaN) has a dielectric breakdown electric field much higher than that of the first-generation semiconductor silicon (Si) or the second-generation semiconductor gallium arsenide (GaAs), and the value thereof is as high as 3 MV/cm, so that the electronic device of the material can withstand a high electric field strength. At the same time, gallium nitride (GaN) can form a heterojunction structure with other gallium-based compound semiconductors (e.g., Group III nitride semiconductors). As Group III nitride semiconductors have strong spontaneous polarization and piezoelectric polarization effects, they can form Two Dimensional Electron Gas (2DEG) channels with high electron concentration near the interface of the heterojunction, and such a heterojunction structure can also effectively reduce scattering of ionized impurities, so the electron mobility in the channel is significantly increased. The gallium nitride high electron mobility transistor formed on the basis of such a heterojunction structure can conduct a high current at a high frequency and has a very low on-resistance. The above characteristics make the gallium nitride high electron mobility transistor suitable for manufacturing high frequency high power radio frequency devices and switching devices with high withstand voltage and high current.

In the manufacturing process of a gallium nitride high electron mobility transistor, gate of the gallium nitride high electron mobility transistor is a Schottky metal-semiconductor contact with rectifying characteristics, and the metals used, such as nickel (Ni), platinum (Pt), and gold (Au), are required having higher work function. Because nickel (Ni) has good adhesion to semiconductor material, it can ensure that the gate metal does not fall off during a stripping process, and nickel (Ni) is generally used as the underlying metal of the gate in contact with the semiconductor material. When the device is operating, the gate and the drain are subjected to a high voltage, and there is an electric field peak at the edge region of the gate close to the drain, which causes an increase in gate current of the device, and thus results in reduced reliability. In the T-type gate manufacturing process, silicon nitride (SiN) is generally used as a blocking layer. In the above device manufacturing method, the Schottky metal-semiconductor contact edge is in contact with the silicon nitride blocking layer to form nickel silicide (NiSi) with a lower work function, and a Schottky contact with high reverse leakage characteristics is formed in the region where the nickel silicide (NiSi) is in contact with the semiconductor material. During operation at high voltage, the location where nickel silicide (NiSi) is generated is changed into a leakage path due to the high electric field, which causes the gate leakage to increase, and thus causes a reliability problem.

The existing method for suppressing a high electron mobility transistor device from forming nickel silicide (NiSi) is to form nickel oxide (NiO) on the edge of nickel (Ni), and it avoids contact between nickel (Ni) and silicon nitride (SiN) by using nickel oxide (NiO), thereby avoiding formation of nickel silicide (NiSi). Although this method can reduce gate leakage of the device, the nickel oxide (NiO) manufacturing process may increase the current collapse of the device, and additional processes are further required to suppress current collapse [see Chinese patent application No. 201410486993.8 and Chinese patent application No. 201010226347.X], which increases the process complexity.

BRIEF DESCRIPTION

In view of the above, the present disclosure aims to provide a semiconductor device and a method for manufacturing the same to solve the problem above.

To achieve the aim above, the present disclosure provides the following technical solutions:

A semiconductor device is provided. The semiconductor device includes a semiconductor layer, a source and a drain located on one side of the semiconductor layer, a blocking layer located on one side of the semiconductor layer, the blocking layer including silicide, and a gate located between the source and the drain, the gate penetrating through the blocking layer, the gate including a first conductive layer and a second conductive layer, the first conductive layer being close to the semiconductor layer, the second conductive layer being located on one side of the first conductive layer away from the semiconductor layer, and the first conductive layer including nickel, wherein the distance between an interface at one side of the blocking layer close to the semiconductor layer and the semiconductor layer is equal to or more than 10 nm.

The distance between an interface at one side of the blocking layer close to the semiconductor layer and the semiconductor layer may be equal to or less than 110 nm.

The distance between an interface at one side of the blocking layer close to the semiconductor layer and the semiconductor layer may be in the range of 15 nm to 55 nm.

A capping layer may be provided between the blocking layer and the semiconductor layer, and the blocking layer directly covers one side of the capping layer away from the semiconductor layer, a thickness of the capping layer being equal to or more than 10 nm.

A thickness of the capping layer may be in the range of 20 nm to 40 nm.

A distance may be preset between a surface of the first conductive layer at one side away from the semiconductor and the blocking layer, so that the first conductive layer is not in contact with the blocking layer.

The gate may further include a transition layer located between the first conductive layer and the second conductive layer, the first conductive layer being isolated from the blocking layer via the transition layer.

The transition layer may include Au or Pt.

A part of the surface of the blocking layer at one side away from the semiconductor layer may be covered with the first conductive layer.

The capping layer may include GaN or AlGaN.

The second conductive layer may include at least one of Au, Rh, In, Al, and Ti.

The gate may penetrate through the blocking layer and extends to the inside of the capping layer or the semiconductor layer.

A method for manufacturing a semiconductor device is provided. The method includes providing a semiconductor layer, forming a source and a drain on one side of the semiconductor layer, forming a blocking layer including silicide on one side of the semiconductor layer, so that the distance between an interface at one side of the blocking layer close to the semiconductor layer and the semiconductor layer is equal to or more than 10 nm, and forming a gate including a first conductive layer and a second conductive layer between the source and the drain, wherein the gate penetrates through the blocking layer, the first conductive layer is close to the semiconductor layer, the second conductive layer is located on one side of the first conductive layer away from the semiconductor layer, and the first conductive layer includes nickel.

The distance between an interface at one side of the blocking layer close to the semiconductor layer and the semiconductor layer may be equal to or less than 110 nm.

A capping layer may be formed between the blocking layer and the semiconductor layer, and the blocking layer directly covers one side of the capping layer away from the semiconductor layer, a thickness of the capping layer being equal to or more than 10 nm.

A distance may be preset between a surface of the first conductive layer at one side away from the semiconductor and the blocking layer, so that the first conductive layer is not in contact with the blocking layer.

The step of forming a gate may include a first conductive layer and a second conductive layer between the source and the drain includes forming a transition layer between the first conductive layer and the second conductive layer, the first conductive layer being isolated from the blocking layer via the transition layer.

The transition layer may include Au or Pt.

The capping layer may include GaN or AlGaN.

The semiconductor device and the method for manufacturing the same provided by the present disclosure reduce the electric field strength at the location where nickel silicide is generated by increasing the distance between an interface of the blocking layer including silicide and the semiconductor layer, reduce gate leakage of the semiconductor device and improve reliability of the device. The semiconductor device provided by the present disclosure has low gate leakage and high reliability, does not suffer from phenomenon of current collapse deterioration, and is suitable for use in a communication system.

BRIEF DESCRIPTION OF THE DRAWINGS

In order to illustrate the technical solutions of the embodiments of the present disclosure more clearly, drawings to be used in the embodiments will be briefly described below. It should be appreciated that the following drawings are merely illustrative of some embodiments of the present disclosure and thus are not intended to limit the scope. Those ordinary skilled in the art can also obtain other related drawings according to these drawings without exercise of inventive skills.

DETAILED DESCRIPTION

Figure 1:
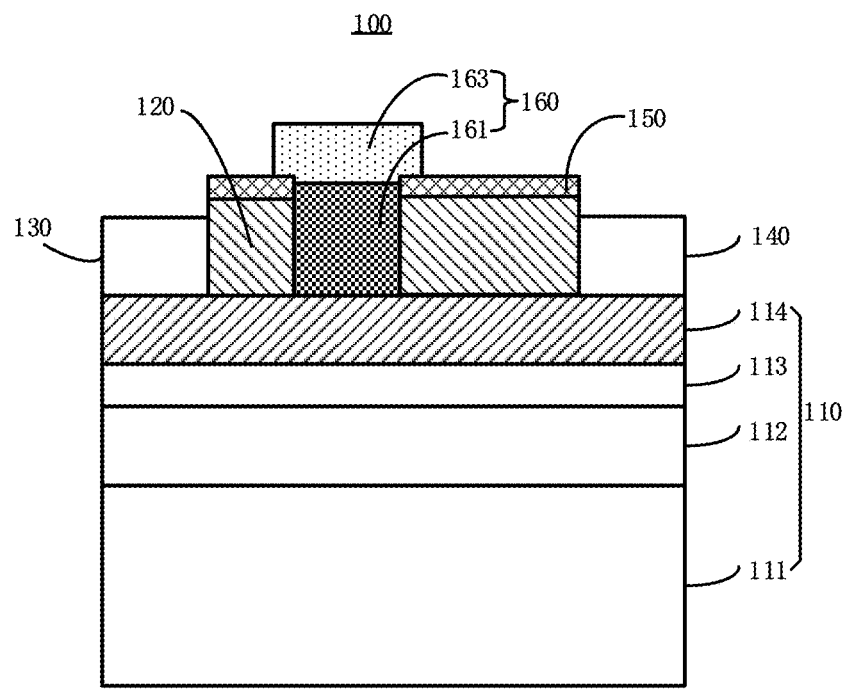
FIG. 1 is a structural schematic diagram of a semiconductor device provided by Embodiment I of the present disclosure.

The technical solutions of the embodiment will be described in a clearly and fully understandable way in connection with the drawings related to the embodiments of the disclosure. It is obvious that the described embodiments are just a part but not all of the embodiments of the disclosure. Generally, the components of the embodiments of the present disclosure described and showed in the accompanying drawings can be arranged and designed with various configurations.

Thus, the detailed description of the embodiment showed in the accompanying drawing of the present disclosure is not for limiting the protection scope of the present disclosure but only for illustrating the selected preferred embodiment of the present disclosure. Based on the embodiment of the present disclosure, other embodiments obtained by those skilled in the art without exercise of inventive skills are also within the protection scope of the present disclosure.

It should be noted that similar reference numerals and letters refer to similar items in the following figures, and thus once an item is defined in one figure, it may not be further defined or explained in the subsequent figures. In the description of the present disclosure, terms such as "first" and "second" are used only for distinguishing the description, and should not be understood as indicating or implying to have importance in relativity.

Embodiment I

Referring to FIG. 1, Embodiment I of the present disclosure provides a semiconductor device 100. The semiconductor device 100 includes a semiconductor layer 110, a capping layer 120, a source 130, a drain 140, a blocking layer 150, and a gate 160.

The semiconductor layer 110 may be a single layer, a double layer, or a multilayer structure composed of one or more semiconductor materials. In a performing form, the semiconductor layer 110 includes a substrate 111, a buffer layer 112, a channel layer 113, and a barrier layer 114. It should be appreciated that in other embodiments or other semiconductor structures, the semiconductor layer 110 may also include more or fewer layers.

The substrate 111 functions to support the buffer layer 112. The substrate 111 may be made of sapphire, silicon carbide (SiC), silicon (Si), lithium niobate, rare earth oxide, gallium nitride (GaN), or any other suitable materials. For instance, the substrate 111 may be made of silicon carbide (SiC) having good heat dispersion characteristics.

The buffer layer 112 is located on one side of the substrate 111. The buffer layer 112 functions to bond the channel layer 113, and protects the substrate 111 from being invaded by some metal ions. The buffer layer 112 is made of at least one of indium aluminum gallium nitride (InAlGaN), aluminum gallium nitride (AlGaN), indium aluminum nitride (InAlN), aluminum nitride (AlN), gallium nitride (GaN), and other semiconductor materials. For instance, the buffer layer 112 is a gallium nitride (GaN) layer or an aluminum gallium nitride (AlGaN) layer with controllable aluminum content.

The channel layer 113 is located on one side of the buffer layer 112 away from the substrate 111 for providing a channel of Two Dimensional Electron Gas (2DEG) motion. The channel layer 113 may be one or more of undoped, n-type doped or n-type partially doped GaN, $Al_xGa_{1-x}N$, $In_xAl_{1-x}N$ or AlN, where $0<x<1$. For instance, the channel layer 113 is an unintentionally doped GaN layer.

The barrier layer 114 is located on one side of the channel layer 113 away from the buffer layer 112 and functions as a barrier to block carriers in the channel layer 113 from flowing to the barrier layer 114. The barrier layer 114 may be one or more of $Al_yGa_{1-y}N$, $In_yAl_{1-y}N$ or AlN, where $0<y<1$. For instance, the barrier layer 114 is an unintentionally doped aluminum gallium nitride (AlGaN) layer. The channel layer 113 and the barrier layer 114 are combined to form a heterojunction structure.

The capping layer 120 is formed based on the semiconductor layer 110 and is located on one side of the barrier layer 114 away from the channel layer 113. The capping layer 120 may reduce the ohmic contact resistance of the source 130 and the drain 140, increase the electron mobility of the 2DEG in the channel, and increase the barrier of Schottky contact of the gate 160, and the capping layer 120 can also play a role of insulation and passivation. In a performing form, the capping layer 120 is a gallium nitride (GaN) layer or an aluminum gallium nitride (AlGaN) layer.

The source 130 and the drain 140 are located on one side of the semiconductor layer 110, and may be located, for example, on one side of the barrier layer 114 of the semiconductor layer 110 away from the channel layer 113. Alternatively, in this embodiment, the source 130 and the drain 140 are formed on opposite sides of the barrier layer 114, respectively. The contact type of the source 130 and the barrier layer 114 is ohmic contact, and the contact type of the drain 140 and the barrier layer 114 is ohmic contact. The source 130 and the drain 140 may be made of one or more metal materials such as nickel (Ni), aluminum (Al), titanium (Ti), gold (Au) etc.

The blocking layer 150 is located on one side of the capping layer 120 away from the semiconductor layer 110 and functions to realize the T-type gate 160 and passivate the surface state of the capping layer 120. The blocking layer 150 includes silicide such as silicon nitride (SiN). The thickness of the blocking layer 150 may be, but is not limited to, equal to or greater than 20 nm. The blocking layer 150 may be a silicon nitride (SiN) layer with a thickness of 50 nm.

In Embodiment I, as shown in FIG. 1, the capping layer 120 is formed based on the semiconductor layer 110 and located on one side of the barrier layer 114 away from the channel layer 113, while the capping layer and the blocking layer 150 are in direct contact. The capping layer 120 can reduce the ohmic contact resistance of the source 130 and the drain 140, increase the electron mobility of the 2DEG in the channel, and increase the barrier of Schottky contact of the gate 160, and the capping layer 120 can also play a role of insulation and passivation. In Embodiment I, the blocking layer 150 directly covers the side of the capping layer 120 away from the semiconductor layer, and the capping layer 120 may be a gallium nitride (GaN) layer or an aluminum gallium nitride (AlGaN) layer.

The gate 160 is located between the source 130 and the drain 140, and the gate 160 extends through the blocking layer 150 to the inside of the capping layer 120 or the semiconductor layer 110. In Embodiment I, the gate 160 extends to the semiconductor layer 110, which means that the gate 160 extends through the capping layer 120 to the semiconductor layer 110. The gate 160 may be a T-type gate structure. In this embodiment, the gate 160 includes a first conductive layer 161 and a second conductive layer 163. The first conductive layer 161 is close to the semiconductor layer 110, and the first conductive layer 161 includes nickel (Ni). The first conductive layer 161 is made of a material containing nickel (Ni) or entirely made of nickel (Ni) to improve adhesion of the metal and the semiconductor material, so that the gate 160 does not easily fall off in a stripping process. In this embodiment, the first conductive layer 161 is made of a metal material containing nickel (Ni) to form an underlying metal structure of the gate 160. The contact type of the gate 160 is Schottky metal-semiconductor contact. The second conductive layer 163 is located on one side of the first conductive layer 161 away from the semiconductor layer 110. The second conductive layer 163 may be made of one or more materials such as gold (Au), rhodium (Rh), indium (In), aluminum (Al), and titanium (Ti). The second conductive layer 163 may reduce resistance of the gate 160 and improve conductivity of the gate 160.

When nickel (Ni) in the first conductive layer 161 is in contact with silicon nitride (SiN) in the blocking layer 150, a nickel silicide (NiSi) having a lower work function is formed at the contact. Schottky contact with high reverse leakage characteristics is formed in the region where the nickel silicide (NiSi) is in contact with the semiconductor material forms, where the magnitude of the Schottky contact reverse leakage is positively correlated with the electric field strength of this region. Formula of the electric field strength at the location where nickel silicide (NiSi) is generated is:

$$E = E_0 * (1 - e^{\frac{-1}{a*T}})$$

where E is the electric field strength at the location where nickel silicide (NiSi) is generated, $E_0$ is the electric field at the interface between the barrier layer 114 and the capping layer 120, the magnitude of which is correlated with the intensity of the polarized electric field in the barrier layer 114, T is the distance between the interface of the blocking layer 150 close to the semiconductor layer 110 and the semiconductor layer 110 (i.e., the distance between the location where nickel silicide (NiSi) is generated and the semiconductor layer), a is an equation coefficient, and values of a in different process flows are different.

Figure 2:
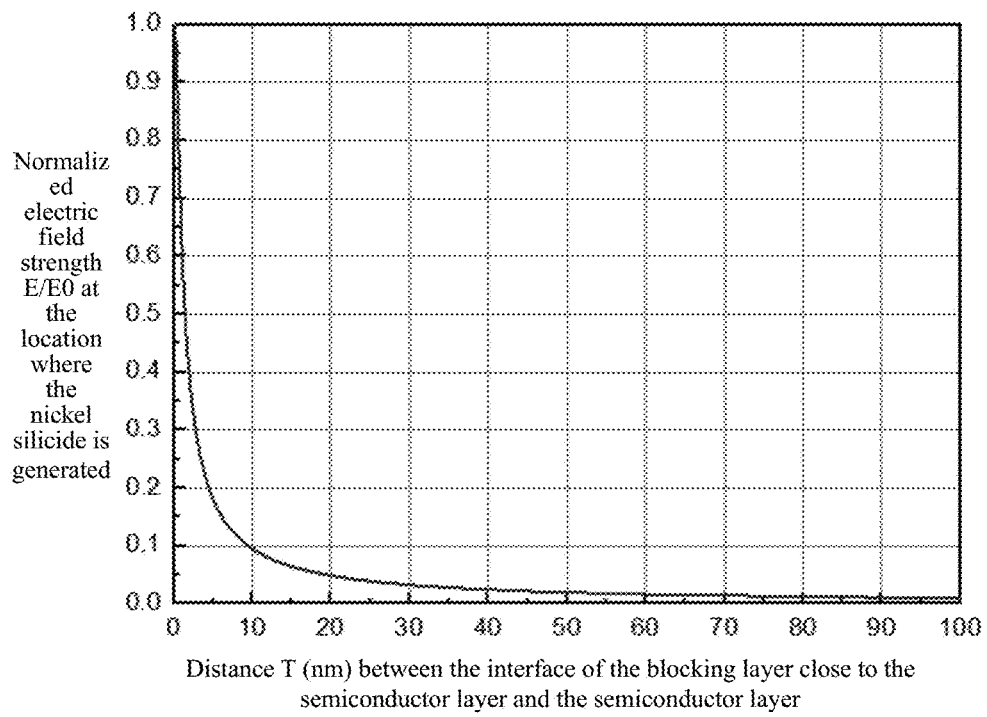
FIG. 2 is a plot of the electric field intensity at the location where nickel silicide is generated of a semiconductor device provided by Embodiment I of the present disclosure versus the distance between the interface of the blocking layer close to the semiconductor layer and the semiconductor layer.

The electric field at the location where nickel silicide (NiSi) is generated at different distances T is simulated, and change of the electric field strength at the location where the normalized nickel silicide (NiSi) is generated with the distances T is shown in FIG. 2. As seen in FIG. 2, when the distance T is 10 nm, the electric field E at the location where nickel silicide (NiSi) is generated is 10% of $E_0$, and the electric field strength at the time is insufficient to cause significant leakage of the gate 160. When the distance T is 90 nm, the electric field E at the location where nickel silicide (NiSi) is generated is 1% of $E_0$, and when the distance T continuously increases, and the electric field at the location where nickel silicide (NiSi) is generated changes slowly.

The distance T between the interface of the blocking layer 150 close to the semiconductor layer 110 and the semiconductor layer 110 may be in the range of 10 nm to 110 nm, which can reduce the process difficulty and the device manufacturing area, thereby facilitating industrial manufacturing more. The distance between the interface of the blocking layer 150 close to the semiconductor layer 110 and the semiconductor layer 110 may be in the range of 15 nm and 55 nm, so that the electric field E at the location where nickel silicide (NiSi) is generated may be made substantially less than 5% of $E_0$, further improving the device reliability.

In Embodiment I, the blocking layer 150 including silicide directly covers the capping layer 120, at the time, the distance between the interface of the blocking layer 150 close to the semiconductor layer 110 and the semiconductor layer 110 is equal to the thickness of the capping layer 120. The capping layer 120 may have a thickness in the range of 10 nm to 110 nm. Furthermore, on the basis of giving full play of the role of the capping layer, it is preferable that the thickness of the capping layer 120 is in the range of 10 nm to 90 nm from the viewpoint of reducing leakage and simplifying the process manufacturing. The capping layer 120 may have a thickness in the range of 20 nm to 40 nm, and the capping layer 120 of such thickness can not only sufficiently reduce leakage but also be easier to implement the process. For instance, when the thickness of the capping layer 120 is 28 nm, the electric field strength E at the location where nickel silicide (NiSi) is generated is 3.5% of $E_0$, and the capping layer 120 having a thickness of 28 nm is easier to implement the process.

In Embodiment I, as shown in FIG. 1, a capping layer 120 is disposed between the blocking layer 150 and the semiconductor layer 110, and the blocking layer 150 directly covers the capping layer 120. However, the blocking layer may also not directly cover the capping layer 120, that is, one or more other layers, such as a dielectric layer, may be disposed between the capping layer 120 and the blocking layer 150.

In addition, the capping layer 120 may not be disposed, and one or more other layers, such as a dielectric layer, may be disposed between the blocking layer 150 and the semiconductor layer 110 to ensure a predetermined distance between the interface of the blocking layer 150 close to the semiconductor layer 110 and the semiconductor layer 110.

Embodiment II

Figure 3:
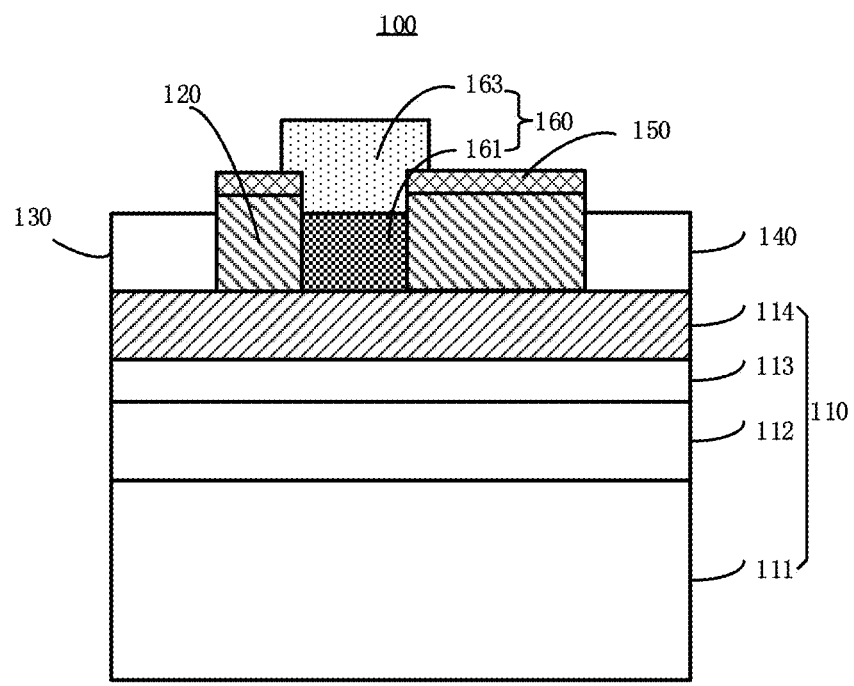
FIG. 3 is a structural schematic diagram of a semiconductor device provided by Embodiment II of the present disclosure.

FIG. 3 is a structural schematic diagram of a semiconductor device 100 provided by Embodiment II of the present disclosure. As shown in FIG. 3, the embodiment is similar to Embodiment I, while the difference is that in Embodiment II, there is a preset distance between the surface on one side of the first conductive layer 161 away from the semiconductor side and the blocking layer 150 so that the first conductive layer 161 is not in contact with the blocking layer 150. The preset distance is flexibly set according to actual conditions, and is not limited herein. That is, the upper surface of the first conductive layer 161 is lower than the lower surface of the blocking layer 150.

Compared with Embodiment I, in the semiconductor device 100 shown in Embodiment II, there is a preset distance between a surface on one side of the first conductive layer 161 away from the semiconductor side and the blocking layer 150, so that the first conductive layer 161 is not in contact with the blocking layer 150, thereby preventing the silicide of the blocking layer 150 from contacting nickel (Ni) of the first conductive layer 161 to generate nickel silicide (NiSi), which results in a problem that nickel silicide (NiSi) becomes a leakage channel under being subjected to a high electric field, this reduces leakage of the gate 160 of the semiconductor device 100 and improves reliability of the semiconductor device 100.

Embodiment III

Figure 4:
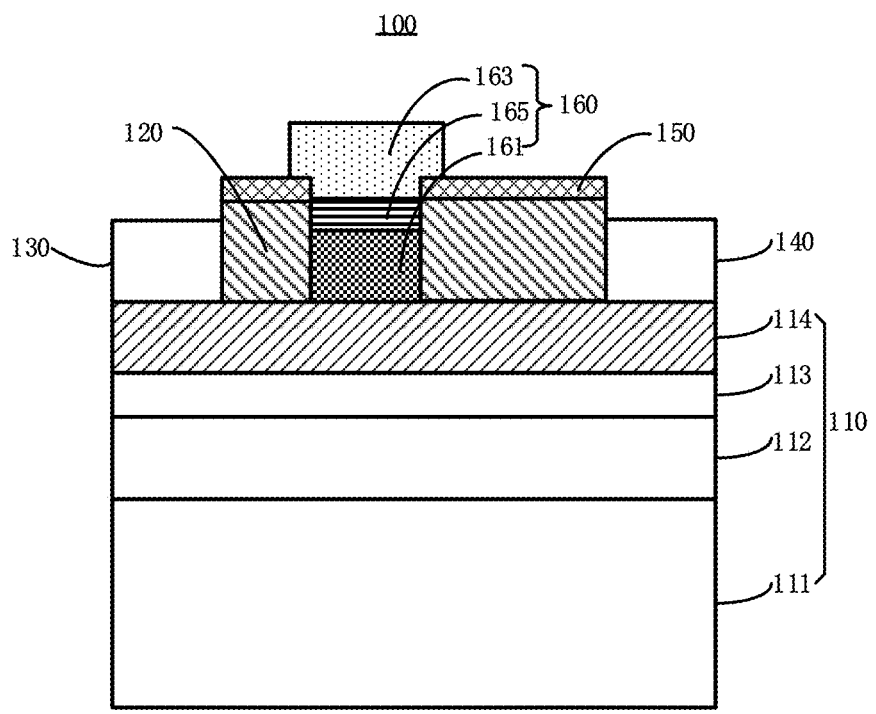
FIG. 4 is a structural schematic diagram of a semiconductor device provided by Embodiment III of the present disclosure.

FIG. 4 is a structural schematic diagram of a semiconductor device 100 provided by Embodiment III of the present disclosure. As shown in FIG. 4, the embodiment is similar to Embodiment II, while the difference is that in Embodiment III, the gate 160 further includes a transition layer 165 between the first conductive layer 161 and the second conductive layer 163, the first conductive layer 161 being isolated from the blocking layer 150 via the transition layer 165. The transition layer 165 may be formed of a metal having a higher work function such as gold (Au) or platinum (Pt). In the present embodiment, the transition layer 165 may be made of platinum (Pt).

Compared with Embodiment I, the semiconductor device 100 shown in Embodiment III adds the transition layer 165 between the first conductive layer 161 and the second conductive layer 163 such that the first conductive layer 161 is isolated from the blocking layer 150 via the transition layer 165, so that nickel silicide (NiSi) is not generated, which avoids the problem that the nickel silicide (NiSi) becomes a leakage channel under being subjected to a high electric field, this reduces leakage of the gate 160 of the semiconductor device 100 and improves reliability of the semiconductor device 100.

Embodiment IV

Figure 5:
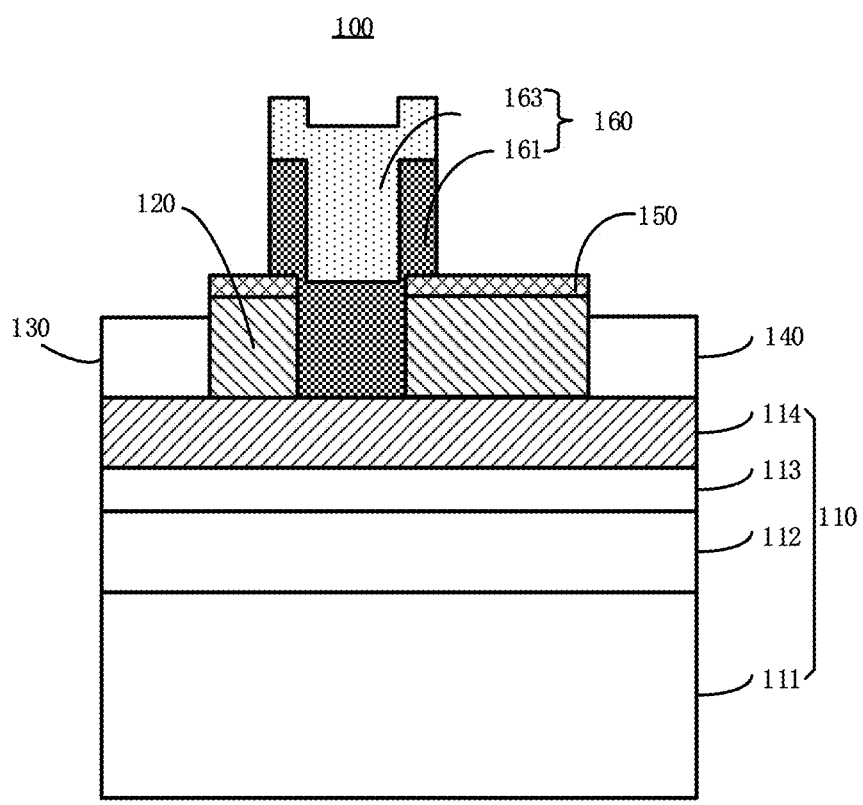
FIG. 5 is a structural schematic diagram of a semiconductor device provided by Embodiment IV of the present disclosure.

FIG. 5 is a structural schematic diagram of a semiconductor device 100 provided by Embodiment IV of the present disclosure. As shown in FIG. 5, the embodiment is similar to Embodiment I, while the difference is that in Embodiment IV, a part of the blocking layer 150 is covered with the first conductive layer 161. In detail, the first conductive layer 161 extends from the barrier layer 114 to the surface at one side of the blocking layer 150 away from the capping layer 120, and then extends upward from the two ends of the blocking layer 150 close to the first conductive layer 161 to form two sidewalls covering a part of the blocking layer 150, respectively, so that a part of the second conductive layer 163 is located between the two sidewalls, while the other part covers the two sidewalls.

Compared with Embodiment I, the semiconductor device 100 shown in Embodiment IV has a simple implementation process, and the electric field strength at the location where nickel silicide (NiSi) is generated is insufficient to cause significant leakage of the gate 160, and reliability of the semiconductor device 100 can be improved.

Embodiment V

Figure 7:
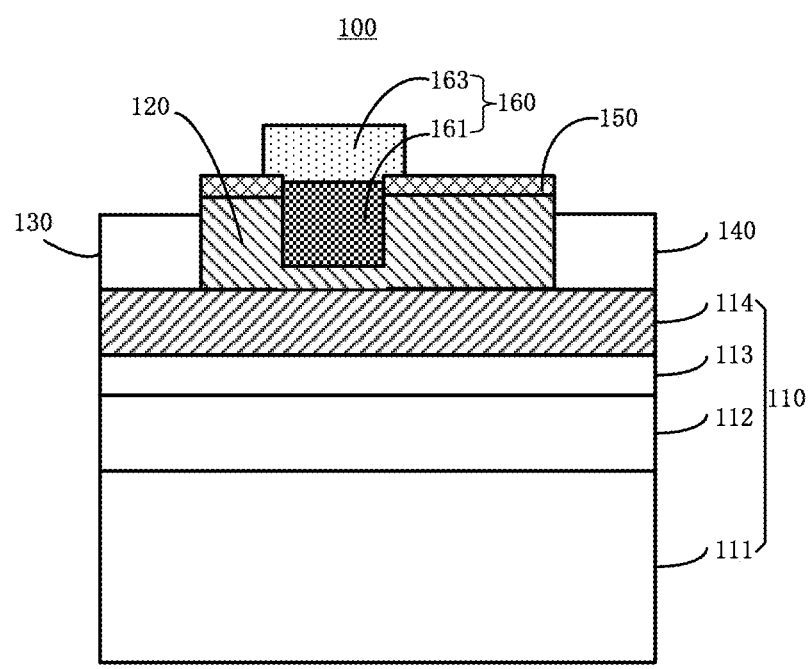
FIG. 7 is a structural schematic diagram of a semiconductor device provided by Embodiment V of the present disclosure.

FIG. 7 is a structural schematic diagram of a semiconductor device 100 provided by Embodiment V of the present disclosure. As shown in FIG. 7, the embodiment is similar to Embodiment I, while the difference is that in Embodiment V, the gate 160 does not penetrate through the capping layer 120, which means that the gate 160 does not extend to the semiconductor layer 110.

Figure 6:
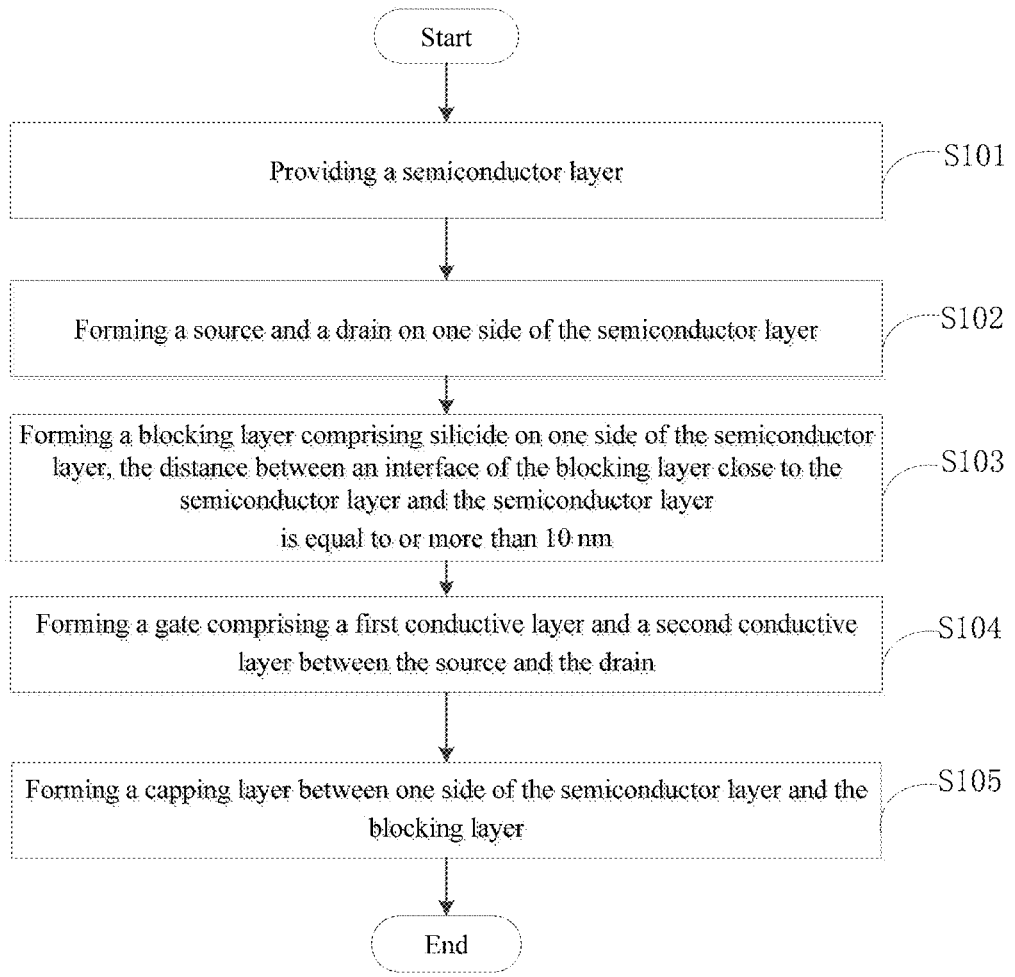
FIG. 6 is a flowchart of a method for manufacturing a semiconductor device provided by an embodiment of the present disclosure.

Referring to FIG. 6, the embodiment of the present disclosure further provides a method for manufacturing a semiconductor device 100, the method including step S101, step S102, step S103, step S104, and step S105.

In step S101, a semiconductor layer 110 is provided.

Figure 6A:
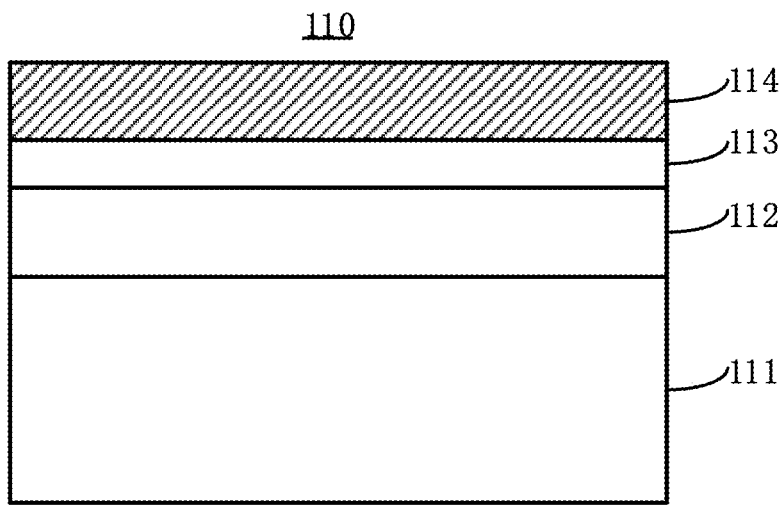
FIG. 6A is a structural schematic diagram of a semiconductor layer manufactured after step S101 shown in FIG. 6 is performed.

As shown in FIG. 6A, the semiconductor layer 110 may be a single layer, a double layer, or a multi-layer structure composed of one or more semiconductor materials. For example, the semiconductor layer 110 may be made of a substrate 111, a buffer layer 112, a channel layer 113, and a barrier layer 114 which are stacked in turn. In step S102, a capping layer 120 having a thickness equal to or more than 10 nm is formed on one side of the semiconductor layer 110.

Figure 6B:
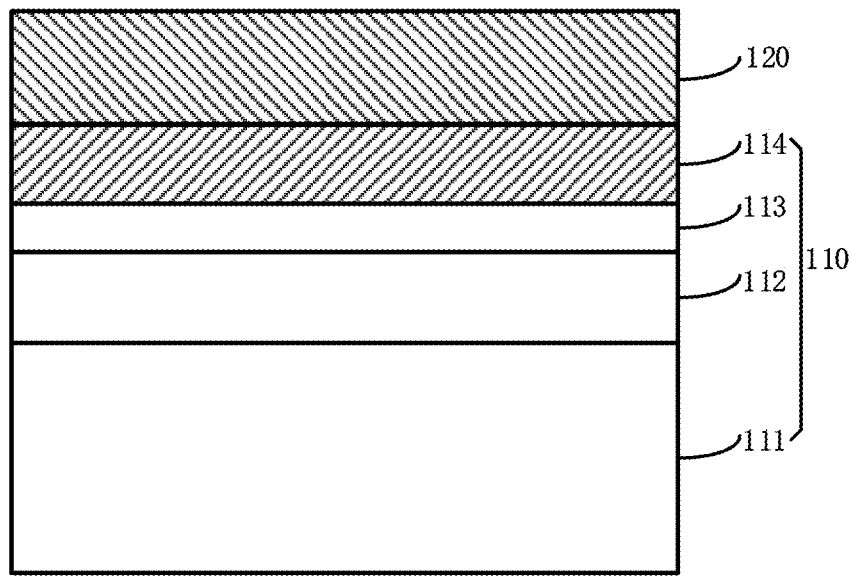
FIG. 6B is a structural schematic diagram after a capping layer is formed by performing step S102 shown in FIG. 6.

As shown in FIG. 6B, a capping layer 120 is formed on one side of the barrier layer 114 away from the channel layer 113, and the capping layer 120 may be made of gallium nitride (GaN) or aluminum gallium nitride (AlGaN) layer. The capping layer 120 may have a thickness in the range of 10 nm to 110 nm. The capping layer 120 may have a thickness in the range of 10 nm to 90 nm, more preferably 20 nm to 40 nm.

In step S103, a source 130 and a drain 140 are formed on one side of the semiconductor layer 110.

Figure 6C:
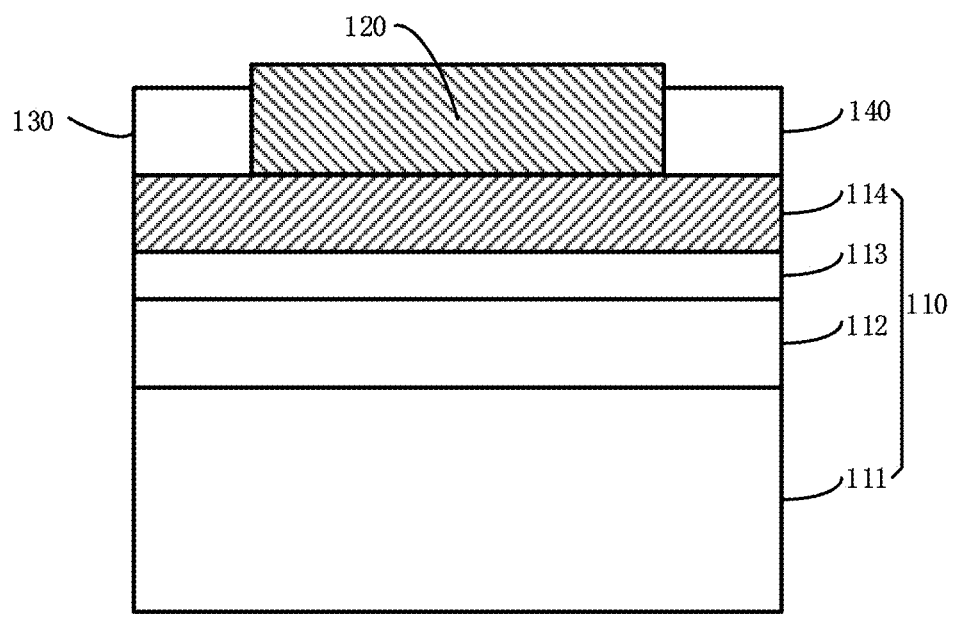
FIG. 6C is a structural schematic diagram after a source and a drain are formed by performing step S103 shown in FIG. 6.

As shown in FIG. 6C, in the embodiment, the source 130 and the drain 140 may be formed on two sides of the capping layer 120, and the source 130 and the drain 140 are both electrically connected to the 2DEG in the channel layer 113. The source 130 and the drain 140 can be manufactured in a variety of methods. In the embodiment, the method for manufacturing the source 130 and the drain 140 is depositing four layers of metals of titanium (Ti), aluminum (Al), nickel (Ni), and gold (Au) from the bottom, using Rapid Thermal Annealing process to form ohmic properties. The purpose of the Rapid Thermal Annealing process is that, on one hand, low-resistance nitride is formed at the interface of the metal semiconductor, and on the other hand, the metals are mutually diffused, and a solid phase interfacial reaction occurs to form a series of thermally stable intermetallic alloys having low-resistance and low work function.

In step S104, a blocking layer 150 including a silicide is formed on one side of the capping layer 120 away from the semiconductor layer 110, so that the distance between the interface of the blocking layer close to the semiconductor layer and the semiconductor layer is equal to or more than 10 nm.

Figures 6D, 6E:
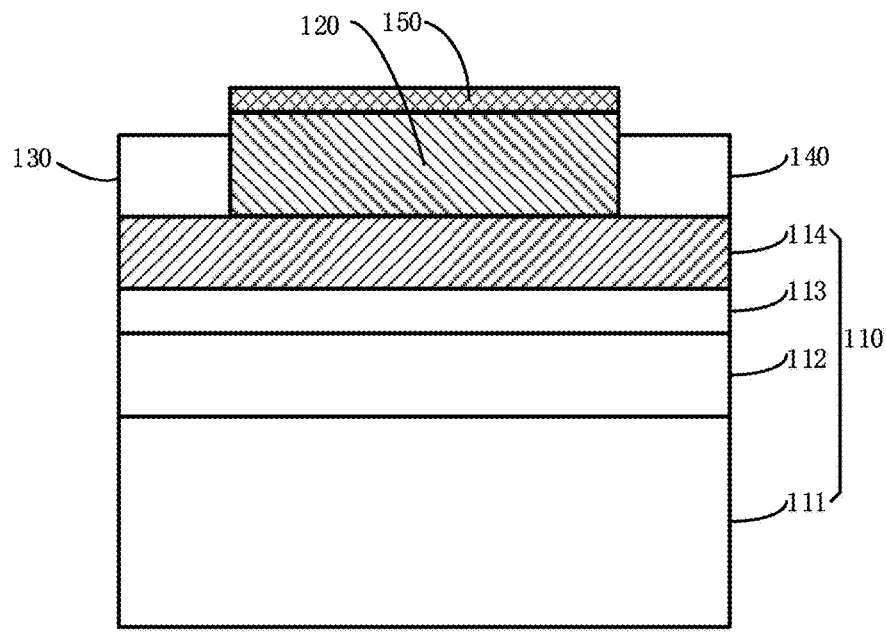
FIG. 6D is a structural schematic diagram after a blocking layer is formed by performing step S104 shown in FIG. 6.
FIG. 6E is a flowchart of sub-steps included in step S105 shown in FIG. 6.

As shown in FIG. 6D, a blocking layer 150 including a silicide is formed on one side of the semiconductor layer 110, so that the distance between the interface of the blocking layer close to the semiconductor layer and the semiconductor layer is equal to or more than 10 nm. The blocking layer 150 may be silicon nitride (SiN), and the distance between the interface on one side of the blocking layer 150 close to the semiconductor layer 110 and the semiconductor layer 110 is equal to or less than 110 nm. The growth method for the blocking layer 150 may be, but not limited to, Metal-organic Chemical Vapor Deposition (MOCVD), Plasma Enhanced Chemical Vapor Deposition (PECVD), Pulsed Laser Deposition (PLD), Molecular Beam Epitaxy (MBE), and thermal growth. The blocking layer 150 may be a single-step process grown dielectric or a multi-step process grown-dielectric. The distance of the interface on one side of the blocking layer 150 close to the semiconductor layer 110 and the semiconductor layer 110 may be in the range of 15 nm to 55 nm.

In step S105, a gate 160 including a first conductive layer 161 and a second conductive layer 163 is formed between the source 130 and the drain 140.

Referring to FIG. 6E, step S105 includes a sub-step S1051 and a sub-step S1052.

In sub-step S1051, the blocking layer 150 and the capping layer 120 between the source 130 and the drain 140 are etched to form a gate trench 167.

Figure 6F:
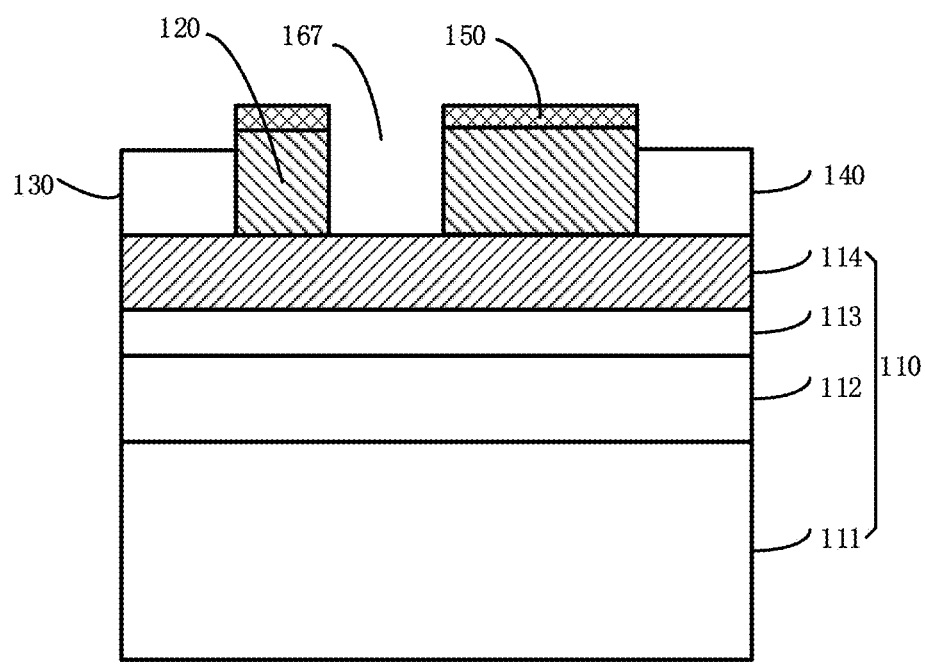
FIG. 6F is a structural schematic diagram after a gate trench is formed by performing sub-step S1051 shown in FIG. 6E.

As shown in FIG. 6F, the blocking layer 150 and the capping layer 120 between the source 130 and the drain 140 are etched to form a gate trench 167, and the etching process may be wet etching or dry etching. The etching depth of the gate trench 167 is controllable, and the etching process time is controlled according to the designed etching depth. The depth of the gate trench 167 may be equal to the sum of the thickness of the capping layer 120 and the thickness of the blocking layer 150.

In sub-step S1052, a gate 160 including a first conductive layer 161 and a second conductive layer 163 is deposited on the gate trench 167.

In the embodiment shown in FIG. 6, the blocking layer 150 is directly formed on the capping layer 120. At the time, the distance between the interface of the blocking layer 150 close to the semiconductor layer 110 and the semiconductor layer 110 is equal to the thickness of the capping layer 120. In addition, the blocking layer 150 may not be formed directly on the capping layer 120, which means that one or more other layers, such as a dielectric layer, may be formed between the capping layer 120 and the blocking layer 150.

In addition, the capping layer 120 may not be formed, and one or more other layers, such as a dielectric layer, may be formed between the blocking layer 150 and the semiconductor layer 110 to ensure a predetermined distance between the interface of the blocking layer 150 close to the semiconductor layer 110 and the semiconductor layer 110.

Corresponding to Embodiment I, Embodiment II, Embodiment III, Embodiment IV, and Embodiment V, there may be at least five structures of the gate electrode 160 deposited on the gate trench 167, as shown in FIG. 1, FIG. 3, and FIG. 4, FIG. 5, and FIG. 7.

A method for forming the gate 160 shown in FIG. 1 includes forming a photoresist opening region on the gate trench 167 by using a one-step photolithography process. The length of the opening region is equal to the trench length of the gate trench 167. The first conductive layer 161 is deposited and formed on the gate trench 167, and the first conductive layer 161 is made of a material including nickel (Ni). The upper surface of the first conductive layer 161 is higher than the upper surface of the capping layer 120 and is in contact with the blocking layer 150. A photoresist opening region is further formed on the gate trench 167 by using a one-step photolithography process. The length of the opening region is greater than the trench length of the gate trench 167. The second conductive layer 163 is formed on the first conductive layer 161, and the second conductive layer 163 may be made of one or more of materials such as gold (Au), rhodium (Rh), indium (In), aluminum (Al), and titanium (Ti). The method for forming the first conductive layer 161 and the second conductive layer 163 may be vacuum evaporation, magnetron sputtering, or the like.

A method for forming the gate 160 shown in FIG. 3 includes forming a photoresist opening region on the gate trench 167 by using a one-step photolithography process. The length of the opening region is equal to the trench length of the gate trench 167, and the first conductive layer 161 is formed on the gate trench 167. The first conductive layer 161 is made of a material including nickel (Ni). The upper surface of the first conductive layer 161 is lower than the lower surface of the blocking layer 150 and is not in contact with the blocking layer 150. A photoresist opening region is further formed on the gate trench 167 by using a one-step photolithography process. The length of the opening region is greater than the trench length of the gate trench 167. The second conductive layer 163 is formed on the first conductive layer 161. The second conductive layer 163 may be made of one or more of materials such as gold (Au), rhodium (Rh), indium (In), aluminum (Al), and titanium (Ti). The method for forming the first conductive layer 161 and the second conductive layer 163 may be vacuum evaporation, magnetron sputtering, or the like.

The gate 160 shown in FIG. 4 further includes a transition layer 165 between the first conductive layer 161 and the second conductive layer 163, the first conductive layer 161 being isolated from the blocking layer 150 via the transition layer 165. Therefore, sub-step S1052 further includes forming a transition layer 165 between the first conductive layer 161 and the second conductive layer 163, the first conductive layer 161 being isolated from the blocking layer 150 via the transition layer 165. A method for forming the gate 160 shown in FIG. 4 includes forming a photoresist opening region on the gate trench 167 by using a one-step photolithography process. The length of the opening region is equal to the trench length of the gate trench 167. The first conductive layer 161 is formed on the gate trench 167. The first conductive layer 161 is made of a material including nickel (Ni). The upper surface of the first conductive layer 161 is lower than the lower surface of the blocking layer 150 and is not in contact with the blocking layer 150. A transition layer 165 is formed on the first conductive layer 161. The transition layer 165 may be made of platinum (Pt) or gold (Au). A photoresist opening region is further formed on the gate trench 167 by using a one-step photolithography process. The length of the opening region is greater than the trench length of the gate trench 167, and the second conductive layer 163 is formed on the transition layer 165. The second conductive layer 163 may be made of one or more of materials such as gold (Au), rhodium (Rh), indium (In), aluminum (Al), and titanium (Ti). The method for forming the first conductive layer 161, the transition layer 165, and the second conductive layer 163 may be vacuum evaporation, magnetron sputtering, or the like.

A method for forming the gate 160 shown in FIG. 5 includes forming a photoresist opening region on the gate trench 167 by using a one-step photolithography process. The length of the opening region is greater than the trench length of the gate trench 167. The first conductive layer 161 is formed on the gate trench 167. The first conductive layer 161 is made of a material including nickel (Ni). As the photoresist opening region is greater than the trench length of the gate trench 167, the blocking layer 150 is covered by the first conductive layer 161, and the sidewall of the first conductive layer 161 is formed on both sides of the gate trench 167. A second conductive layer 163 is formed on the first conductive layer 161. The second conductive layer 163 may be made of one or more of materials such as gold (Au), rhodium (Rh), indium (In), aluminum (Al), and titanium (Ti). The method for forming the first conductive layer 161 and the second conductive layer 163 may be vacuum evaporation, magnetron sputtering, or the like.

A method for forming the gate 160 shown in FIG. 7 includes forming a photoresist opening region on the gate trench 167 by using a one-step photolithography process. The length of the opening region is equal to the trench length of the gate trench 167. The first conductive layer 161 is deposited and formed on the gate trench 167. The first conductive layer 161 is made of a material including nickel (Ni). The upper surface of the first conductive layer 161 is higher than the upper surface of the capping layer 120 and is in contact with the blocking layer 150. The lower surface of the first conductive layer 161 does not penetrate through the capping layer 120 and is in contact with the capping layer 120. A photoresist opening region is further formed on the gate trench 167 by using a one-step photolithography process. The length of the opening region is greater than the trench length of the gate trench 167. The second conductive layer 163 is formed on the first conductive layer 161. The second conductive layer 163 may be made of one or more of materials such as gold (Au), rhodium (Rh), indium (In), aluminum (Al), and titanium (Ti). The method for forming the first conductive layer 161 and the second conductive layer 163 may be vacuum evaporation, magnetron sputtering, or the like.

In the semiconductor device 100 provided by the present disclosure, electric field strength at the location where nickel silicide (NiSi) is generated is reduced by increasing the thickness of the capping layer 120, or a preset distance is set between the surface at one side of the first conductive layer 161 away from the semiconductor and the blocking layer 150 or a transition layer 165 is added between the first conductive layer 161 and the second conductive layer 163 so as to avoid generation of nickel silicide (NiSi). The leakage of the gate 160 of the semiconductor device 100 is reduced and reliability of the semiconductor device 100 is improved. The semiconductor device 100 does not suffer from phenomenon of current collapse deterioration, and is suitable for use in a communication system.

In the description of the present disclosure, it should be noted that terms "set", "connected", "connection" etc. should be understood in a broad sense unless otherwise specified and defined. For example, the term "connection" may be a fixed connection, may be a detachable connection or an integrated connection, may be a mechanical connection, or an electrical connection, may be direct connection, or indirect connection through an intermediate media, or may involve internal connection of two components. For those skilled in the art, the specific meanings of the terms can be understood in particular cases in the embodiments of the present disclosure.

In the description of the present disclosure, it should also be noted that the orientation or location relationships indicated by terms such as "upper", "lower", "inside", "outside", etc. are based on the orientation or positional relations as shown in the drawings, or the orientation or positional relations in which the inventive product is conventionally placed in use, and these terms are intended only to facilitate the description of the present disclosure and simplify the description, but not intended to indicate or imply that the referred devices or elements must be in a particular orientation or constructed or operated in the particular orientation, and therefore should not be construed as limiting the present disclosure.

The above is only example embodiments of the present disclosure and not intended to limit the present disclosure. For those skilled in the art, various modifications and changes can be made to the present disclosure. Any modification, equivalent substitute and improvement within the spirit and principle of the present disclosure are deemed to be included within the scope of the present disclosure.

What is claimed is:

1. A semiconductor device comprising:
a semiconductor layer;
a source and a drain located on one side of the semiconductor layer;
a blocking layer located on one side of the semiconductor layer, the blocking layer comprising silicide; and
a gate located between the source and the drain, the gate penetrating through the blocking layer, the gate comprising a first conductive layer and a second conductive layer, the first conductive layer close to the semiconductor layer, the second conductive layer located on one side of the first conductive layer away from the semiconductor layer, and the first conductive layer comprising nickel, wherein a distance between an interface at one side of the blocking layer close to the semiconductor layer and the semiconductor layer is equal to or more than 10 nm;
wherein the gate further comprises a transition layer located between the first conductive layer and the second conductive layer, and wherein the first conductive layer is isolated from the blocking layer via the transition layer.

2. The semiconductor device according to claim 1, wherein the distance between the interface at one side of the blocking layer close to the semiconductor layer and the semiconductor layer is equal to or less than 110 nm.

3. The semiconductor device according to claim 2, wherein the distance between the interface at one side of the blocking layer close to the semiconductor layer and the semiconductor layer is in a range of 15 nm to 55 nm.

4. The semiconductor device according to claim 1, wherein a capping layer is provided between the blocking layer and the semiconductor layer, wherein the blocking layer directly covers one side of the capping layer away from the semiconductor layer, and wherein a thickness of the capping layer is equal to or more than 10 nm.

5. The semiconductor device according to claim 4, wherein a thickness of the capping layer is in a range of 20 nm to 40 nm.

6. The semiconductor device according to claim 1, wherein a distance is preset between a surface of the first conductive layer at one side away from the semiconductor and the blocking layer, so that the first conductive layer is not in contact with the blocking layer.

7. The semiconductor device according to claim 1, wherein the transition layer comprises one of Au and Pt.

8. The semiconductor device according to claim 4, wherein the capping layer comprises one of GaN and AlGaN.

9. The semiconductor device according to claim 1, wherein the second conductive layer comprises at least one of Au, Rh, In, Al, and Ti.

10. The semiconductor device according to claim 4, wherein the gate penetrates through the blocking layer and extends to the inside of the capping layer or the semiconductor layer.

11. A method for manufacturing a semiconductor device, the method comprising:
providing a semiconductor layer;
forming a source and a drain on one side of the semiconductor layer;
forming a blocking layer comprising silicide on one side of the semiconductor layer, so that a distance between an interface at one side of the blocking layer close to the semiconductor layer and the semiconductor layer is equal to or more than 10 nm; and
forming a gate comprising a first conductive layer and a second conductive layer between the source and the drain, wherein the gate penetrates through the blocking layer, wherein the first conductive layer is close to the semiconductor layer, wherein the second conductive layer is located on one side of the first conductive layer away from the semiconductor layer, and wherein the first conductive layer comprises nickel;
wherein the step of forming a gate comprising a first conductive layer and a second conductive layer between the source and the drain comprises:
forming a transition layer between the first conductive layer and the second conductive layer, the first conductive layer isolated from the blocking layer via the transition layer.

12. The method according to claim 11, wherein the distance between the interface at one side of the blocking layer close to the semiconductor layer and the semiconductor layer is equal to or less than 110 nm.

13. The method according to claim 11, wherein a capping layer is formed between the blocking layer and the semiconductor layer, wherein the blocking layer directly covers one side of the capping layer away from the semiconductor layer, and wherein a thickness of the capping layer being equal to or more than 10 nm.

14. The method according to claim 11, wherein a distance is preset between a surface of the first conductive layer at one side away from the semiconductor and the blocking layer, so that the first conductive layer is not in contact with the blocking layer.

15. The method according to claim 11, wherein the transition layer comprises one of Au and Pt.

16. The method according to claim 13, wherein the capping layer comprises one of GaN and AlGaN.

* * * * *

UNITED STATES PATENT AND TRADEMARK OFFICE
CERTIFICATE OF CORRECTION

PATENT NO. : 10,686,063 B2  
APPLICATION NO. : 16/080235  
DATED : June 16, 2020  
INVENTOR(S) : Yi Pei et al.

Page 1 of 1

It is certified that error appears in the above-identified patent and that said Letters Patent is hereby corrected as shown below:

On the Title Page

Item (30), in Foreign Application Priority Data, insert therefor -- April 14, 2017 (CN) 21710245923.7 --.

Signed and Sealed this  
Twenty-second Day of December, 2020

Andrei Iancu  
*Director of the United States Patent and Trademark Office*